United States Patent
Schiller et al.

(10) Patent No.: US 11,397,121 B2
(45) Date of Patent: Jul. 26, 2022

(54) MICROMECHANICAL PRESSURE SENSOR SYSTEM AND METHOD FOR MANUFACTURING A MICROMECHANICAL PRESSURE SENSOR SYSTEM

(71) Applicant: Robert Bosch GmbH, Stuttgart (DE)

(72) Inventors: Uwe Schiller, Tuebingen (DE); Daniel Haug, Neuffen (DE); Lars Sodan, Balingen (DE); Michael Knauss, Pfullingen (DE); Robert Kuells, Reutlingen (DE); Sebastian Schuler-Watkins, Herrenberg (DE)

(73) Assignee: Robert Bosch GmbH, Stuttgart (DE)

( * ) Notice: Subject to any disclaimer, the term of this patent is extended or adjusted under 35 U.S.C. 154(b) by 118 days.

(21) Appl. No.: 16/620,117

(22) PCT Filed: May 17, 2018

(86) PCT No.: PCT/EP2018/062880
§ 371 (c)(1),
(2) Date: Dec. 6, 2019

(87) PCT Pub. No.: WO2018/224278
PCT Pub. Date: Dec. 13, 2018

(65) Prior Publication Data
US 2020/0200634 A1  Jun. 25, 2020

(30) Foreign Application Priority Data
Jun. 8, 2017 (DE) .......................... 102017209650.0

(51) Int. Cl.
*G01L 19/00* (2006.01)
*G01L 19/14* (2006.01)
*F16J 15/02* (2006.01)

(52) U.S. Cl.
CPC .......... *G01L 19/142* (2013.01); *F16J 15/022* (2013.01); *G01L 19/147* (2013.01)

(58) Field of Classification Search
CPC ...... G01L 19/142; G01L 19/147; F16J 15/022
See application file for complete search history.

(56) References Cited

U.S. PATENT DOCUMENTS 6,214,634 B1 * 4/2001 Osajda ................ G01L 19/0645
338/42
8,359,927 B2  1/2013 Hooper et al.
(Continued)

FOREIGN PATENT DOCUMENTS

| CN | 102084234 A | 6/2011 |
| DE | 102009028033 | 2/2011 |

(Continued)

OTHER PUBLICATIONS

International Search Report for PCT/EP2018/062880, dated Aug. 13, 2018.

*Primary Examiner* — Jamel E Williams
(74) *Attorney, Agent, or Firm* — Norton Rose Fulbright US LLP; Gerard Messina (57) ABSTRACT

A micromechanical pressure sensor system, including: a substrate; a pressure sensor component connected to the substrate; and an essentially hollow frustum-shaped sleeve structure, which is connected to the substrate, which surrounds the pressure sensor component at least laterally and which has an opening at a side of the sleeve structure facing away from the substrate.

16 Claims, 5 Drawing Sheets

(56) References Cited

U.S. PATENT DOCUMENTS

| | | | |
|---|---|---|---|
| 10,184,910 B2* | 1/2019 | Lammel | G01L 19/0092 |
| 2011/0036174 A1 | 2/2011 | Hooper et al. | |
| 2011/0138921 A1* | 6/2011 | Colombo | G01L 19/0038 |
| | | | 73/706 |
| 2011/0203359 A1* | 8/2011 | Borzabadi | G01L 19/147 |
| | | | 73/114.37 |

FOREIGN PATENT DOCUMENTS

| | | | |
|---|---|---|---|
| DE | 102010039599 | 2/2012 | |
| EP | 2365308 | 9/2011 | |
| EP | 3318861 | 5/2018 | |
| WO | 9847424 | 10/1998 | |
| WO | WO-2012022572 A1 * | 2/2012 | G01L 19/0084 |

\* cited by examiner

MICROMECHANICAL PRESSURE SENSOR SYSTEM AND METHOD FOR MANUFACTURING A MICROMECHANICAL PRESSURE SENSOR SYSTEM

FIELD

The present invention relates to micromechanical pressure sensor systems and to methods for manufacturing micromechanical pressure sensor systems.

BACKGROUND INFORMATION

Mechanical pressure sensors are needed for a plurality of applications. The increasing miniaturization of mobile terminals means that ever more miniaturized pressure sensor systems are needed, which advantageously have a preferably small footprint, i.e., require preferably little space and are thus integratable in a preferably versatile manner into different mobile terminals.

Conventional concepts in the packaging of integrated circuits of micromechanical components, including, in particular, of micromechanical sensors, apply different approaches to packaging to accommodate such components in a preferably space-saving and protected manner, without impairing their function.

In the case of so-called land grid arrays (LGA), e.g., all components of a circuit are integrated into a tiny housing, which usually encompasses only few cubic millimeters. Such miniaturized circuits represent a considerable challenge for the so-called second-level packaging, i.e., the further processing into a sensor including attachment options, terminals and more of the like in a mobile terminal.

German Patent Application No. DE 10 2009 028033 A1 describes a sensor system including a sensor module for pressure detection, including a connecting piece and at least one seal for coupling the sensor module to a measuring system.

SUMMARY

The present invention provides micromechanical pressure sensor systems, and methods for manufacturing micromechanical pressure sensor systems.

An example micromechanical pressure sensor system is thus provided in accordance with the present invention, including: a substrate, a pressure sensor component connected to the substrate, and an essentially hollow frustum-shaped sleeve structure, which is connected to the substrate, which surrounds the pressure sensor component at least laterally and which has an opening on a side of the sleeve structure facing away from the substrate.

A pressure sensor component may be understood to mean, for example, any component which picks up a pressure signal and converts it into a data signal. Pressure sensor components are frequently designed in such a way that they include a pressure sensor diaphragm, which is deformable by outside pressure fluctuations and pressure waves, this deformation being detected by elements situated at the pressure sensor diaphragm, frequently by a piezoelectric bridge circuit, and converted into a data signal.

The sleeve structure may also be referred to as a sleeve or a sensor sleeve.

Furthermore, an example micromechanical pressure sensor system is provided in accordance with the present invention, including: a substrate, a pressure sensor component connected to the substrate, and a sleeve structure, which is connected to the substrate, which surrounds the pressure sensor component at least laterally and which includes a circumferential groove at a lateral outer side of the sleeve structure facing away from the pressure sensor component.

Moreover, an example method for manufacturing a micromechanical pressure sensor system is provided in accordance with the present invention, including the steps: providing a micromechanical pressure sensor system including a substrate, a pressure sensor component connected to the substrate, and an essentially hollow frustum-shaped sleeve structure, which is connected to the substrate, which surrounds the pressure sensor component at least laterally and which has an opening on a side of the sleeve structure facing away from the substrate; providing a housing; and connecting the housing to the substrate and to the sleeve structure in a gas-tight manner with the aid of a sealing material in a sealing area, which is situated at the substrate and/or at the sleeve structure in an area between the substrate and an end of the sleeve structure facing away from the substrate.

Furthermore, an example method for manufacturing a micromechanical pressure sensor system is provided in accordance with the present invention, including the steps: providing a micromechanical pressure sensor system including a substrate, a pressure sensor component connected to the substrate, and a sleeve structure, which is connected to the substrate, which surrounds the pressure sensor component at least laterally and which includes a circumferential groove at a lateral outer side of the sleeve structure facing away from the pressure sensor component; providing a housing; situating a sealing ring in the groove; and situating the housing around the sleeve structure at the sealing ring in a gas-tight manner.

SUMMARY

In accordance with the present invention, an example micromechanical pressure sensor system is provided which includes or enables a seal seat between a sleeve structure, which represents a first-level packaging (FLP), and a second-level packaging (SLP), which overall enables a preferably flat micromechanical pressure sensor system. This is made possible in all specific embodiments by an advantageous shape of the sleeve structure.

Advantageous specific embodiments and refinements are derived from the description below with reference to the figures.

According to one preferred refinement of the present invention, the sleeve structure is filled entirely or partially with a gel. According to another preferred refinement of the present invention, the sleeve structure includes a closure structure which closes the opening. Such a gel, or such a closure structure, may, on the one hand, transmit pressure fluctuations, and, on the other hand, may protect components and elements enclosed by the gel, or protected by the closure structure, against outside influences, which may result in corrosion or, in general, in damage to the sensor component, for example.

According to another preferred refinement of the present invention, the closure structure includes an oil-repelling layer and/or an opaque layer. In this way, the pressure sensor component may be protected even better against outside influences.

According to another preferred refinement of the present invention, the pressure sensor system includes a housing, which is connected to the substrate and/or to the sleeve structure in a gas-tight manner in a sealing area with the aid of a sealing material. The sealing area is advantageously situated at the substrate and/or at the sleeve structure in an area between the substrate and an end of the sleeve structure facing away from the substrate. In this way, a particularly flat pressure sensor system may be provided.

According to another preferred refinement of the present invention, the sealing area includes an area on a surface of the substrate which radially surrounds the sleeve structure, or is made up of such an area.

According to another preferred refinement of the present invention, the sealing area includes a surface of a radially extending flange of the essentially hollow frustum-shaped sleeve structure or is made up of such a surface.

According to another preferred refinement of the present invention, the sealing area includes at least a portion of a frustum jacket of the hollow frustum-shaped sleeve structure, or the entire frustum jacket, or is made up of a portion of the frustum jacket or of the frustum jacket.

According to another preferred refinement of the present invention, the housing includes a recess on an end of the housing facing the substrate, in which the sealing material and/or the flange of the sleeve structure engage(s) for forming a mechanical stop. In this way, sliding of the housing with respect to the substrate and/or the sleeve structure may be mitigated or prevented.

According to another preferred refinement of the present invention, the pressure sensor system includes a housing and a sealing ring, which is situated in a circumferential groove of the sleeve structure. The housing is advantageously connected to the sleeve structure in a gas-tight manner with the aid of the sealing ring.

BRIEF DESCRIPTION OF THE DRAWINGS

The present invention is described in greater detail hereafter based on the exemplary embodiments shown in the schematic figures.

In all figures, identical or functionally equivalent elements and devices are denoted by the same reference numerals, unless indicated otherwise. The numbering of method steps is used for the sake of clarity and is, in particular, not intended to imply a certain chronological sequence, unless indicated otherwise. In particular, multiple method steps may also be carried out simultaneously.

DETAILED DESCRIPTION OF EXAMPLE EMBODIMENTS

Figure 1:
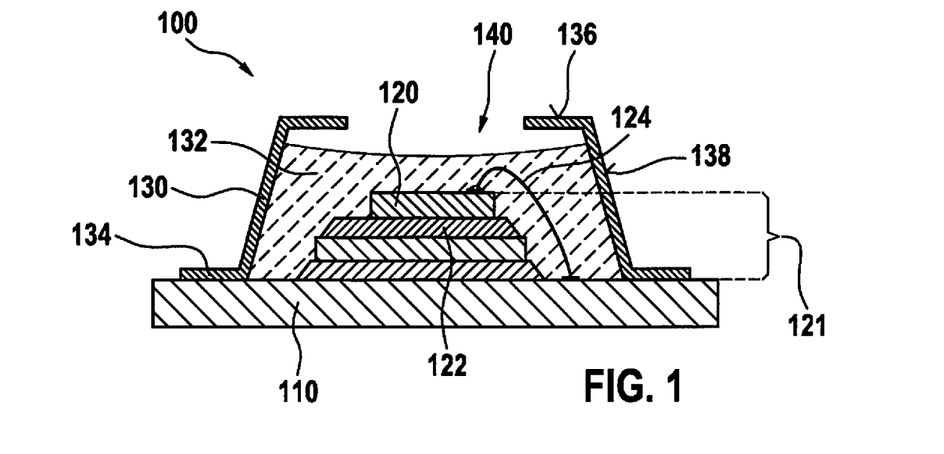
FIGS. 1-11, 13 and 14 show schematic cross-sectional representations of micromechanical pressure sensor systems according to different specific embodiments of the present invention.

FIG. 1 shows a schematic cross-sectional representation of a micromechanical pressure sensor system 100 according to one specific embodiment. Micromechanical pressure sensor system 100 includes a substrate 110. Substrate 110 may be a ceramic substrate, for example.

Substrate 110 may also be an LGA substrate. In other words, contact surfaces (lands) situated in a checkerboard-like manner may be situated on the surface of substrate 110 shown at the bottom of FIG. 1. Instead of an LGA substrate, substrate 110 may also be designed as a pin grid array (PGA), which includes pins instead of the lands, or as a ball grid array (BGA), which includes solder balls instead of the lands. Substrate 110 may also be designed as a ceramic column grid array (CCGA), in which column-like solder terminals made of highly leaded solder are situated on the underside of substrate 110, shown at the bottom of FIG. 1, in a grid, as in the case of a BGA.

On the surface of substrate 110 shown at the top of FIG. 1, which may be a surface of substrate 110 facing away from the lands, a pressure sensor component 120 is connected to substrate 110. In the exemplary embodiment shown in FIG. 1, pressure sensor component 120 is the uppermost component of a chip stack 121, which is connected to substrate 110. In addition to pressure sensor component 120, chip stack 121 may advantageously also include an application-specific integrated circuit (ASIC).

Pressure sensor component 120 may be glued onto the application-specific integrated circuit. The application-specific integrated circuit and pressure sensor component 120 may also be situated next to one another on substrate 110. Pressure sensor component 120 may be a flip chip component, which is connected to substrate 110 with the aid of underfill. If the application-specific integrated circuit and pressure sensor component 120 are situated next to one another, the application-specific integrated circuit may, for example, also be connected to substrate 110 using the flip chip process, or be glued onto substrate 110.

Electrical connections between pressure sensor component 120 and the application-specific integrated circuit and/or substrate 110 may, for example, be established by bond wires 124 and/or by electrical connections on substrate 110, in substrate 110 or through substrate 110. In particular, when the application-specific integrated circuit and pressure sensor component 120 are situated next to one another on substrate 110, electrical connections between these two components may also be exclusively established by bond wires. An electrical connection between the application-specific integrated circuit and substrate 110 may take place using the flip chip process or, for example, also by wire bonds.

In addition, an essentially hollow frustum-shaped sleeve structure 130, which laterally surrounds chip stack 121, in particular, pressure sensor component 120, and which has an opening 140 on an axial end 136 of sleeve structure 130 facing away from substrate 110, is connected to substrate 110. A wider axial end of the frustum structure of sleeve structure 130 faces substrate 110, and a narrower axial end faces away from substrate 110. When above and hereafter mention is made of radial, tangential and axial directions, this information shall always be understood with respect to the frustum structure of sleeve structure 130.

In some specific embodiments, sleeve structure 130 may be designed completely in a hollow frustum shape. However, the shape of sleeve structure 130 shown by way of example in FIG. 1 is preferred, which, in addition to the hollow frustum-shaped main structure, also includes a radial flange 134, which is preferably situated at an axial end of sleeve structure 130 facing away from opening 140, i.e., at the axial end of sleeve structure 130 facing substrate 110.

In the specific embodiment shown in FIG. 1, sleeve structure 130 is partially filled with a gel 132. Gel 132 transmits pressure fluctuations, which penetrate from the outside through opening 140, to pressure sensor component 120, in particular, to a pressure sensor diaphragm of pressure sensor component 120, but at the same time advantageously protects pressure sensor component 120, bond wires 124 and, if necessary, additional sensitive elements of chip stack 121, e.g., against corrosion. Sleeve structure 130 may be completely filled with gel 132. Sleeve structure 130 is preferably filled with gel 132 at least to such an extent that chip stack 121 is completely covered with gel 132.

Opening 140 in sleeve structure 130 may extend in the radial direction across the entire axial end 136 of sleeve structure 130, i.e., may extend completely between an axial edge of a frustum jacket 138 of hollow frustum-shaped sleeve structure 130. As an alternative, as is shown in FIG. 1, opening 140 may be smaller than the surface area spanned by the axial edge of frustum jacket 138, whereby a robustness of sleeve structure 130 may improve. The size of opening 140 may be selected as a function of the desired application, it being possible to find and select a balance between a larger opening 140 for an improved pick-up of pressure signals from the surroundings and a smaller opening 140 for a more robust sleeve structure 130.

A smaller opening 140 also simplifies a handling of micromechanical pressure sensor system 100 during a pick and place process, simplifies a direct integration into the SLP, and enables further advantageous designs, as is described hereafter, in particular, with reference to the figures.

If, in contrast, opening 140 extends completely between the axial edge of frustum jacket 138, this may simplify the process of filling sleeve structure 130 with gel 132 in that, on the one hand, gel 132 has to be conducted less precisely through a small opening and, on the other hand, the absence of an undercut allows small bubbles in gel 132 to be prevented.

Sleeve structure 130 is preferably manufactured in a deep drawing process and/or from a metal. If sleeve structure 130 is manufactured from deep drawn metal, walls of sleeve structure 130, in particular, frustum jacket 138, may be designed to be particularly thin, while nonetheless having good structural strength.

The frustum shape of sleeve structure 130 enables an easy integration of micromechanical pressure sensor system 100, for example into an SLP housing, as will be described in greater detail hereafter. Moreover, the hollow frustum shape of sleeve structure 130 may effectuate a reduction in small bubbles in gel 132 or may effectuate that fewer small bubbles, or no small bubbles at all, arise in gel 132.

If sleeve structure 130 is filled completely with gel 132, this has the advantage that an ingress of water into sleeve structure 130 is not, or rarely, possible, so that there is no risk that water having penetrated into sleeve structure 130 freezes, expands and damages or destroys pressure sensor component 120.

Figure 2:
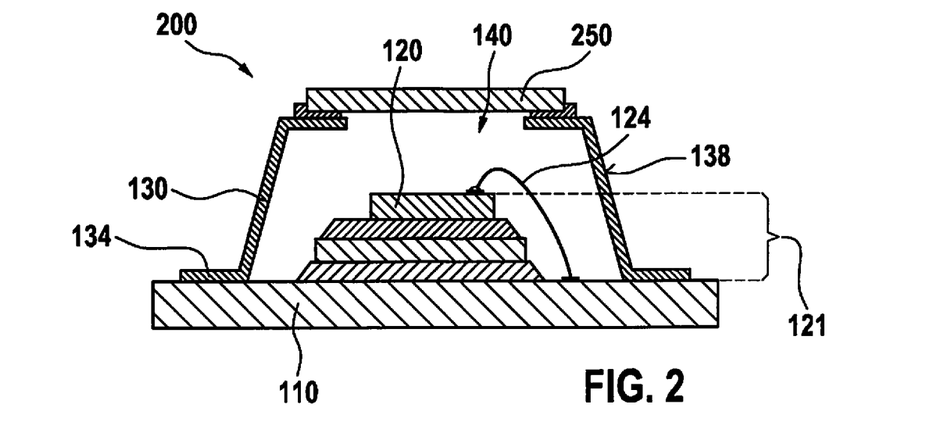

FIG. 2 shows a schematic cross-sectional representation of a micromechanical pressure sensor system 200 according to another specific embodiment. Pressure sensor system 200 is a variant of pressure sensor system 100 and differs therefrom in that, on the one hand, no gel 132 is situated in sleeve structure 130 and, on the other hand, that opening 140 is closed by a closure structure 250. In other words, in the case of pressure sensor system 200, closure structure 250 protects the interior of sleeve structure 130 and thus, in particular, pressure sensor component 120 against interfering outside influences. Closure structure 250 may, in particular, be a diaphragm which is movable, and thus transmits pressure fluctuations and pressure waves from the outside to the interior of sleeve structure 130, and thus to pressure sensor component 120, in particular, to a pressure sensor diaphragm of pressure sensor component 120. The diaphragm is particularly preferably a water-impermeable diaphragm, so that water also cannot penetrate into the interior of sleeve structure 130 in the case of pressure sensor system 200.

As is shown in FIG. 2, structures, with the aid of which closure structure 250 is connected to sleeve structure 130, may be situated at the axial end of sleeve structure 130 between the edge of frustum jacket 138 and opening 140.

In one possible variant of pressure sensor system 200, the interior of sleeve structure 130, for example as described with reference to FIG. 1, may be entirely or partially filled with a gel 132. Closure structure 250 is preferably an oil-repelling diaphragm in this case. This makes it possible that, for example, oil may be situated outside the diaphragm, which is kept away from gel 132 in sleeve structure 130 by the diaphragm. If such oil and gel 132 come in contact, it is possible that the viscoelastic behavior of gel 132 may change, whereby, in turn, changes in the sensitivity and in an offset of pressure sensor component 120 surrounded by gel 132 may arise. In addition, the diaphragm is preferably designed to be opaque to reduce a light sensitivity of pressure sensor component 120.

Figure 3:
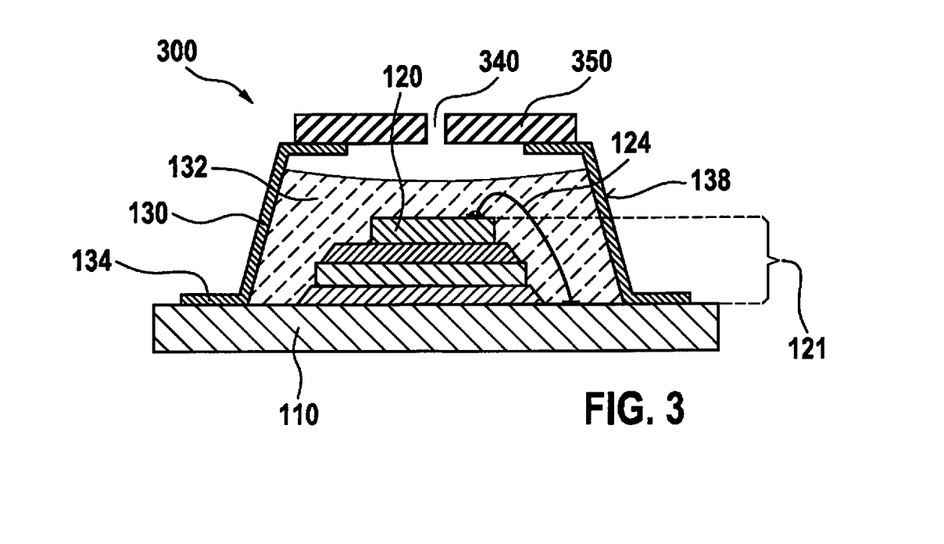

FIG. 3 shows a schematic cross-sectional representation of a micromechanical pressure sensor system 300 according to yet another specific embodiment. Pressure sensor system 300 is also a variant of pressure sensor system 100 and differs therefrom in that opening 140 in pressure sensor system 300 is partially closed by a closure structure 350, which may be a flexible sealing structure, for example made up of an elastomer, such as rubber and/or a silicone. The interior of sleeve structure 130 including the pressure sensor component 120 is no longer connected to the surroundings via the entire opening 140 in sleeve structure 130, but only via an opening 340 in closure structure 350. This opening 340 may, in particular, be smaller than opening 140 and may thus reduce the light incident on the pressure sensor component. Due to the flexible properties of closure structure 350, it is also able to transmit pressure waves and pressure fluctuations from the outside world to the interior of sleeve structure 130 including pressure sensor component 120.

In the case of pressure sensor system 300, the interior of sleeve structure 130 may be completely filled with gel 132. As an alternative, as is shown in FIG. 3, sleeve structure 130 may only be filled partially with gel 132. A space between gel 132 and flexible closure structure 350 may fill with water. When this water freezes, it expands. Due to the flexible properties of closure structure 350, a possibly damaging force is advantageously reduced, which may be exerted onto gel 132, bond wires 124, pressure sensor component 120 and the like due to the expansion of the ice.

Figure 4:
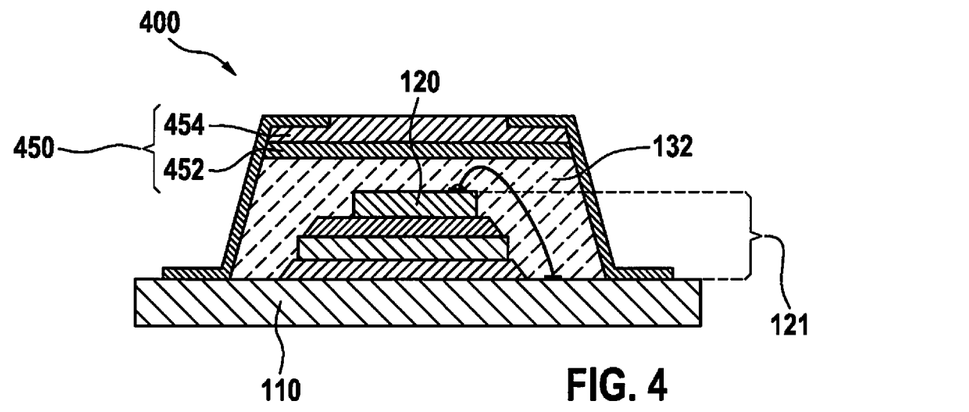

FIG. 4 shows a schematic cross-sectional representation of a micromechanical pressure sensor system 400 according to yet another specific embodiment. Pressure sensor system 400 is a variant of pressure sensor system 200. Instead of closure structure 250, which is formed by a diaphragm, pressure sensor system 400 includes a closure structure 450 which includes an opaque layer 452 and an oil-repelling layer 454, with the aid of which opening 140 in sleeve structure 130 is closed. Closure structure 450 has the same advantages as the opaque, oil-repelling diaphragm as closure structure 250.

Figure 5:
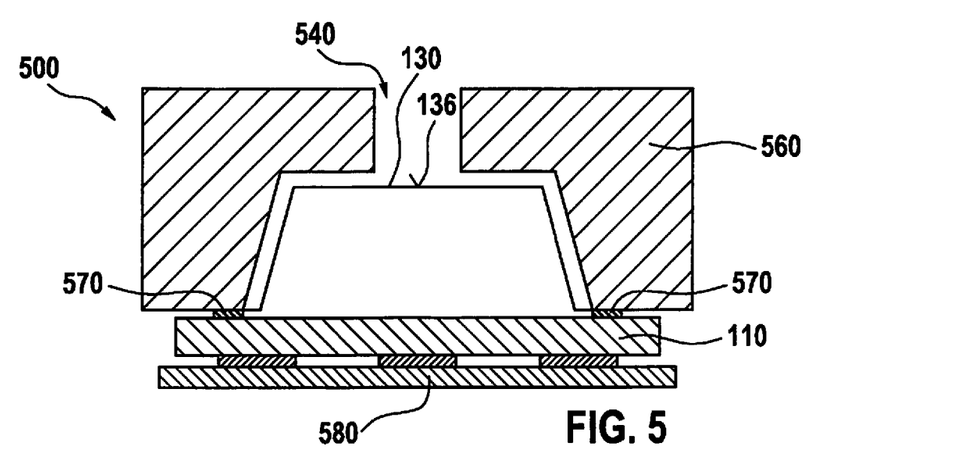

FIG. 5 shows a schematic cross-sectional representation of a micromechanical pressure sensor system 500 according to yet another specific embodiment. Pressure sensor system 500 includes a micromechanical pressure sensor system, including a substrate 110 and an essentially hollow frustum-shaped sleeve structure 130, in which a pressure sensor component 120 connected to substrate 110 is situated, in particular a micromechanical pressure sensor system 100; 200; 300; 400 according to one of FIGS. 1 through 4, or according to one of the variants and/or refinements described with reference to pressure sensor systems 100; 200; 300; 400.

At its axial end facing substrate 110 and connected to substrate 110, sleeve structure 130 of micromechanical pressure sensor system 500 includes a radially extending flange 134, which is directly connected to substrate 110. A printed circuit board (PCB) is situated on the surface of substrate 110 facing away from sleeve structure 130, which may, for example, be designed as or with an LGA, BGA, PGA or CCGA, and accordingly electrically connected to substrate 110 and mechanically connected to substrate 110.

Pressure sensor system 500 includes a housing 560, which may be part of an SLP, for example. Housing 560 may be a cell phone housing, for example, a watch housing, for example of a smart watch, or another housing of a portable electronic device. In a sealing area 570, housing 560 is connected to substrate 110 and sleeve structure 130 in a gas-tight manner with the aid of a sealing material. The sealing material may be an elastomer, for example, or an adhesive.

An opening 540 in housing 560 is situated and designed in such a way that the, sealed or unsealed, opening 140 in sleeve structure 130 is connected to the surroundings for receiving pressure fluctuations and/or pressure waves, either by a fluidic connection or by a flexible closure structure 250; 350; 450.

In the case of pressure sensor system 500, housing 560 includes an interior which is connected to opening 540 and which has a frustum-shaped design and furthermore is shaped in such a way that there is room for the frustum-shaped portion of sleeve structure 130 in the interior. Sealing area 570 is a surface of substrate 110 which is situated to radially adjoin flange 134 of sleeve structure 130, in particular, to directly abut flange 134. Advantageously, in the case of pressure sensor system 500, a lower end, i.e., an end of housing 560 facing substrate 110, may be designed to be comparatively larger than in approaches from the related art, so that substrate 110 and housing 560 overall are connected to one another in a more stable manner, and substrate 110 is stabilized by housing 560. A force acting for connecting housing 560 to substrate 110 may act from beneath, for example, in FIG. 5.

Figure 6:
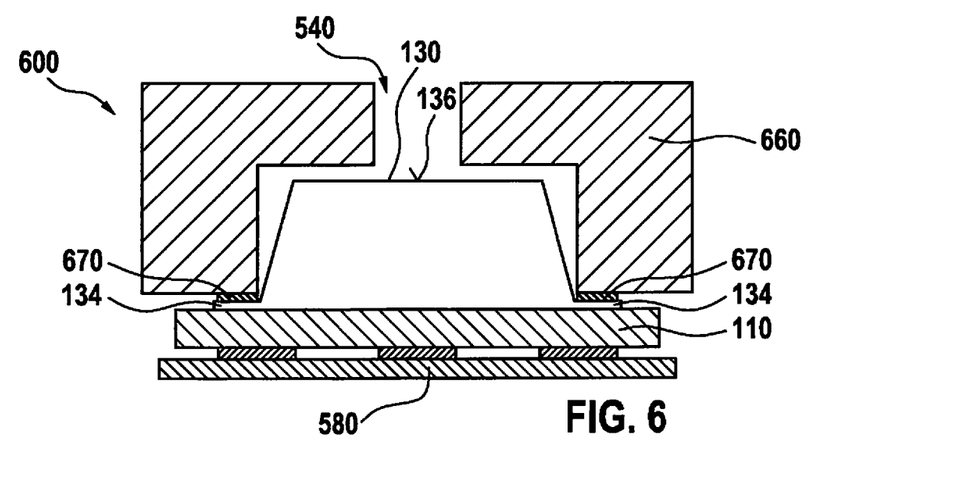

FIG. 6 shows a schematic cross-sectional representation of a micromechanical pressure sensor system 600 according to yet another specific embodiment. Pressure sensor system 600 is a variant of pressure sensor system 500 and differs therefrom in the shape of the interior of housing 660 of pressure sensor system 600 and in the arrangement of sealing area 670 of pressure sensor system 600.

In the case of pressure sensor system 600, the interior of housing 660 has a cylindrical design. Sealing area 670 is advantageously situated on a surface of flange 134 of sleeve structure 130 facing away from substrate 110, and preferably extends in a closed annular shape on flange 134 around frustum structure of sleeve structure 130.

Figure 7:
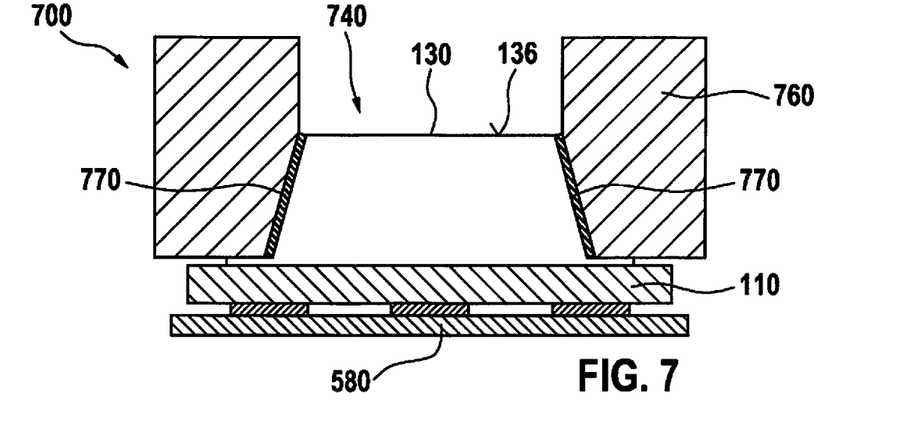

FIG. 7 shows a schematic cross-sectional representation of a micromechanical pressure sensor system 700, which is another variant of pressure sensor system 500. In contrast to housing 560 of pressure sensor system 500, a housing 760 of pressure sensor system 700 including a hollow frustum-shaped interior cavity is designed in such a way that a sealing area 770 of pressure sensor system 700 is situated between frustum jacket 138 of sleeve structure 130 and the corresponding slanted inner walls of the interior cavity of housing 760, which rest precisely against frustum jacket 138. Compared to opening 540 in housing 560 of pressure sensor system 500, an opening 740 in housing 760 may be designed, in the radial direction, exactly as the axial end 136 of sleeve structure 130 facing away from substrate 110. However, opening 740 in housing 760 may also be designed as is shown in FIG. 5 with reference to pressure sensor system 500, and vice versa. In the case of pressure sensor system 700, the arrangement of sealing area 770 has the advantage that no clearance remains between sleeve structure 130 and housing 760, or, in other words, between FLP and SLP, so that water cannot penetrate there, and accordingly damage due to such water freezing cannot arise.

Figure 8:
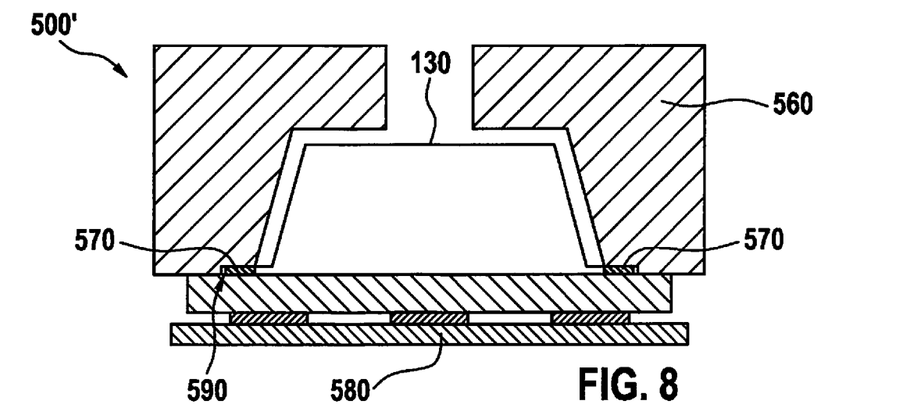
Figure 9:
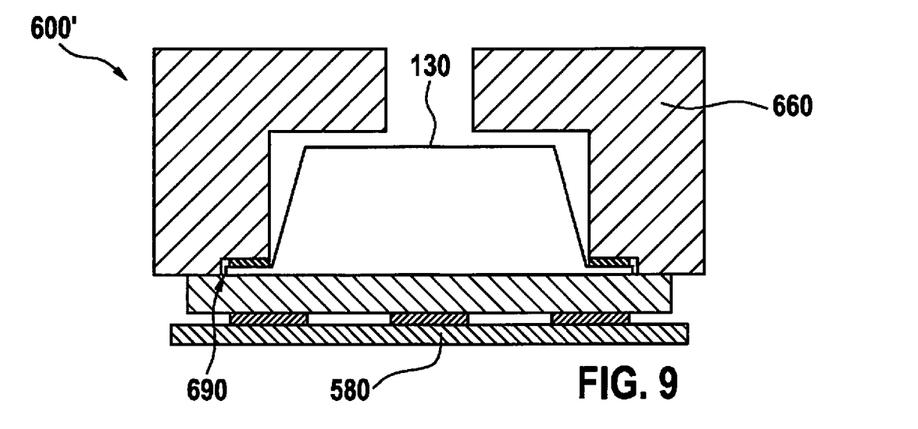
Figure 10:
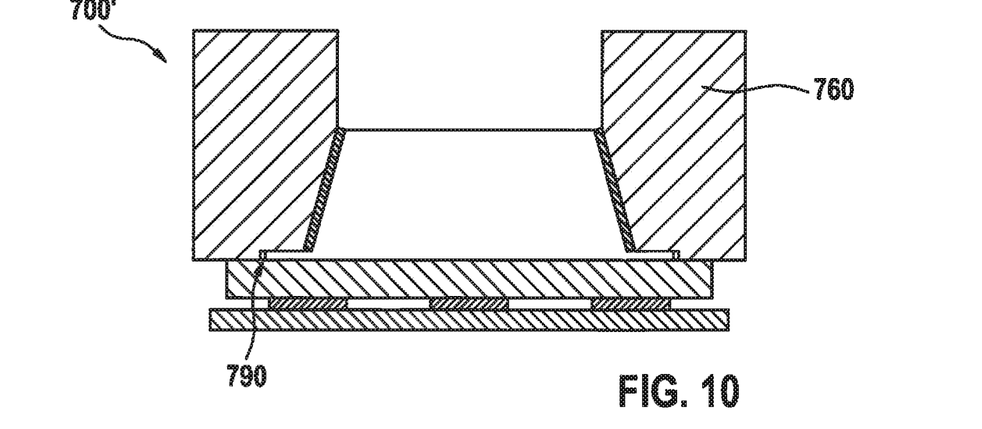

FIGS. 8, 9 and 10 show pressure sensor systems 500'; 600'; 700' which each represent variants of pressure sensor systems 500; 600; 700 and which each differ therefrom in that the respective housing 560; 660; 760, at a respective end of housing 560; 660; 760 facing substrate 110, includes a respective recess 590; 690; 790 in which the sealing material and/or flange 134 of sleeve structure 130 engages for forming a mechanical stop. In this way, a sliding of housing 560; 660; 760 in the radial direction with respect to sleeve structure 130 may be mitigated or prevented. Recess 590; 690; 790 may be formed in sections, in the tangential direction or in the circumferential direction, or may be formed completely along the circumference of the interior of housing 560; 660; 760.

Figure 11:
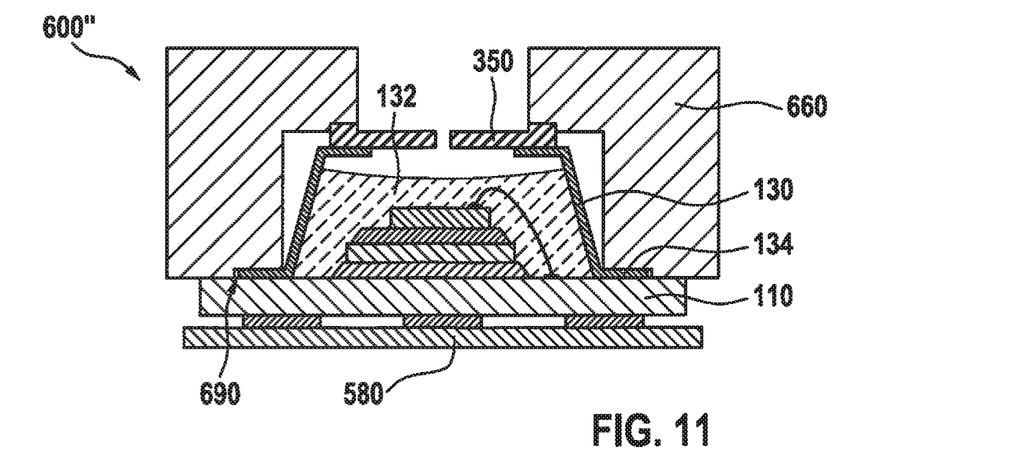

FIG. 11 shows a schematic cross-sectional representation of a micromechanical pressure sensor system 600" which represents a variant of pressure sensor system 600'. In the case of pressure sensor system 600", housing 660 encloses sleeve structure 130 together with a closure structure 350, as described above with reference to pressure sensor system 300 based on FIG. 3. Housing 660 may advantageously project inwardly in the radial direction to such an extent that it ends up on flexible closure structure 350 and/or that it may be connected to flexible closure structure 350. In this way, overall an even tighter connection may be obtained between housing 660 and the remaining elements of pressure sensor system 600".

The sealing area between housing 660 and substrate 110 and/or sleeve structure 130 on pressure sensor system 600" may thus encompass an area of flange 134 of sleeve structure 130 and/or an area of flexible closure structure 350. It shall be understood that further variants and options are possible, for example, housing 660 may also include slanted inner walls, such as housing 560 of pressure sensor system 500; 500' or housing 760 of pressure sensor systems 700; 700'.

Figure 12:
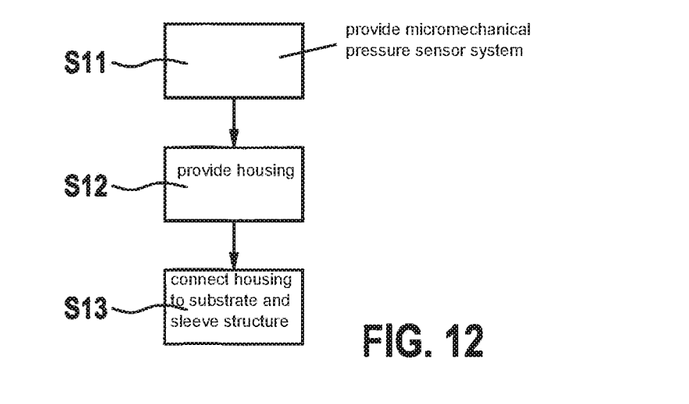
FIGS. 12 and 15 show schematic flow charts to explain methods for manufacturing micromechanical pressure sensor systems according to additional specific embodiments of the present invention.

FIG. 12 shows a schematic flow chart to explain a method for manufacturing a micromechanical pressure sensor system. The method according to FIG. 12 is adaptable for manufacturing any above-described micromechanical pressure sensor system 100; 200; 300; 400; 500; 500'; 600; 600'; 700; 700' and all corresponding options and modifications, and vice versa.

In a step S11, a micromechanical pressure sensor system 100; 200; 300; 400 is provided, as it was explained above with reference to FIGS. 1 through 4.

In a step S12, a housing 560; 660; 760 is provided, for example, and is designed in such a way as described above with reference to one of FIGS. 5 through 10.

In a step S13, the provided housing 560; 660; 760 is connected in a gas-tight manner to substrate 110 and to sleeve structure 130 with the aid of a sealing material in a sealing area 570; 670; 770. Sealing area 570; 670; 770 is advantageously situated at substrate 110 and/or at sleeve structure 130 in an area between substrate 110 and an axial end 136 of sleeve structure 130 facing away from substrate 110. Sealing area 570; 670; 770 is particularly preferably situated in a way as is explained above with reference to FIGS. 5 through 7.

Figure 13:
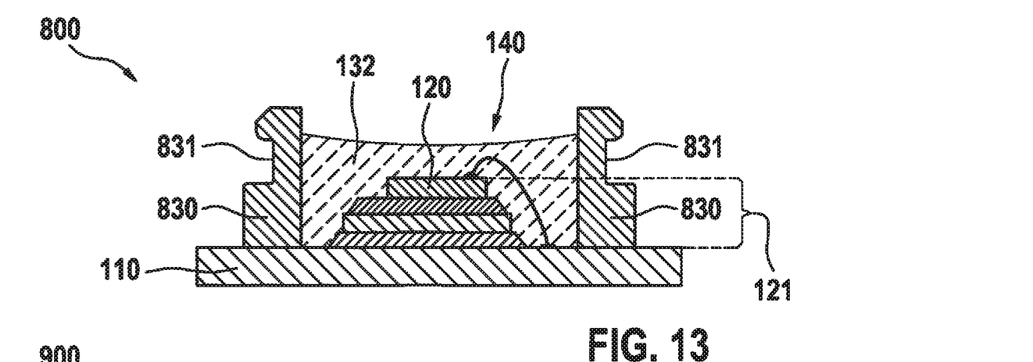

FIG. 13 shows a schematic cross-sectional view of a pressure sensor system 800 according to yet another specific embodiment. Pressure sensor system 800 is a variant of pressure sensor system 100 and differs therefrom in the configuration of sleeve structure 830 of pressure sensor system 800 instead of sleeve structure 130 of pressure sensor system 100.

In contrast to sleeve structure 130, sleeve structure 830 of pressure sensor system 800 does not necessarily have an essentially hollow frustum-shaped design. Instead, as shown in FIG. 13, sleeve structure 830 may have an essentially hollow cylindrical design. The idea that an integration of pressure sensor system 800 at higher levels, for example in an SLP, may be achieved in a preferably space-saving manner in the radial direction proceeding from sleeve structure 830 is implemented in the specific embodiment according to FIG. 13 in that sleeve structure 830 includes a circumferential groove 831 at a lateral outer side of sleeve structure 830 facing away from pressure sensor component 120.

Groove 831 is provided for inserting a sealing ring (O-ring) into groove 831 and for serving as a seal seat for a gas-tight connection of a housing, in particular, of an SLP housing, to sleeve structure 830. The SLP housing may be such a housing as was explained above for FIGS. 5 through 10 with reference to FIG. 5, i.e., it may, in particular, be a housing of a mobile terminal, such as of a smart phone, of a smart watch and the like.

A cross-sectional profile of sleeve structure 830 may be designed differently on the two sides of groove 831. In particular, as shown in FIG. 13, the area of sleeve structure 830 situated further away from substrate 110 than groove 831 may be designed with a lesser thickness in the radial direction than the section of sleeve structure 830 formed closer to substrate 110 than groove 831. This shape of sleeve structure 830 facilitates the insertion of the sealing ring from above into groove 831, and makes it more difficult for the sealing ring to slide away downwardly, i.e., in the direction of substrate 110, over groove 831.

Figure 14:
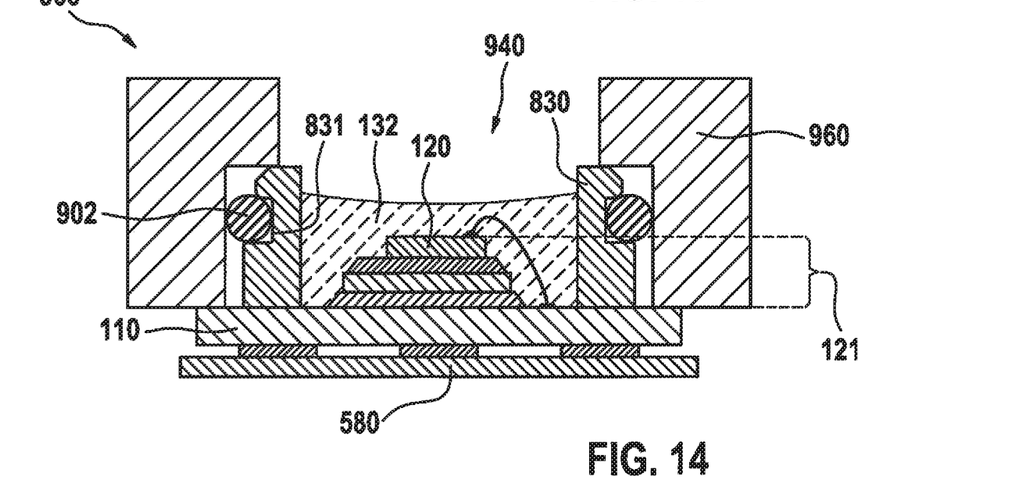

FIG. 14 shows a micromechanical pressure sensor system 900 according to another specific embodiment, which represents a variant of pressure sensor system 500, pressure sensor system 800 according to FIG. 13 being enclosed by a housing 960 as an SLP instead of a pressure sensor system 100; 200; 300; 400 according to one of FIGS. 1 through 4. As is apparent from FIG. 14, a sealing ring 902 is inserted into groove 831 in sleeve structure 830, and a housing 960 is connected to sleeve structure 830 in a gas-tight manner, with sealing ring 902 as the seal seat. In the specific embodiment shown in FIG. 14, an opening 940 in housing 960, in the radial direction, is larger than the cylindrical interior of sleeve structure 830 in which chip stack 121 is situated. However, opening 940 may also be designed to be smaller. It is advantageous when housing 960, as is also shown in FIG. 14, projects inwardly in the radial direction, and thereby at least partially overlaps the hollow cylinder jacket of sleeve structure 830.

Figure 15:
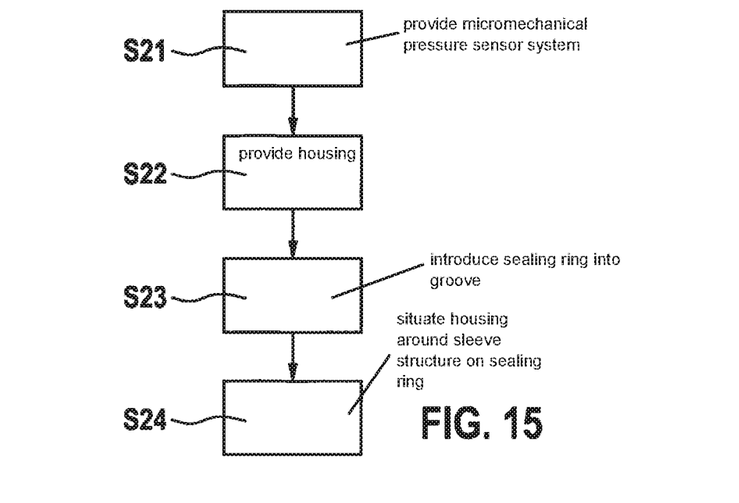

FIG. 15 shows a schematic flow chart to explain a method for manufacturing a micromechanical pressure sensor system 900 according to yet another specific embodiment. The method according to FIG. 15 may be applied, in particular, for manufacturing a micromechanical pressure sensor system 900 from FIG. 14 and is adaptable in accordance with all variants and modifications described with reference to micromechanical pressure sensor system 900, and vice versa.

In a step S21, a micromechanical pressure sensor system 800 is provided, as it was explained with reference to FIG. 13. The special feature of this pressure sensor system 800 is that sleeve structure 830 of pressure sensor system 800 includes a circumferential groove 831 in a lateral outer side of sleeve structure 830 facing away from a pressure sensor component 120, into which a sealing ring 902 may be introduced.

In a step S22, a housing 960 is provided, preferably a housing 960 as it was explained above with reference to FIG. 14. In a step S23, a sealing ring 902 is situated in groove 831 in sleeve structure 830 of micromechanical pressure sensor system 800 or, in other words, is introduced into groove 831. In a step S24, housing 960 is situated around sleeve structure 830 on sealing ring 902 in a gas-tight manner. In other words, housing 960 is placed around sleeve structure 830 on sealing ring 902 in such a way that sealing ring 902 represents a gas-tight seal seat between housing 960 and sleeve structure 830.

Although the present invention has been described above based on preferred exemplary embodiments, it is not limited thereto, but is modifiable in a variety of ways. The present invention may in particular be changed or modified in multiple ways without departing from the core of the present invention.

What is claimed is:

1. A micromechanical pressure sensor system, comprising:
   a substrate;
   a pressure sensor component connected to the substrate; and
   an essentially hollow frustum-shaped sleeve structure connected to the substrate, the sleeve structure surrounding the pressure sensor component at least laterally and having an opening at a side of the sleeve structure facing away from the substrate, wherein a wider axial end of the sleeve structure faces the substrate and a narrower axial end of the sleeve structure faces away from substrate, and an interior of the sleeve structure bounded by jacket walls of the sleeve structure is narrower at the narrower axial end than at the wider axial end;
   wherein the sleeve structure is filled with a gel.

2. The micromechanical pressure sensor system as recited in claim 1, wherein the sleeve structure includes a closure structure which closes the opening.

3. The micromechanical pressure sensor system as recited in claim 2, wherein the closure structure includes an oil-repelling layer.

4. The micromechanical pressure sensor system as recited in claim 1, further comprising:
   a housing, which, in a sealing area, is connected to the substrate and to the sleeve structure in a gas-tight manner using a sealing material, the sealing area being situated at the substrate and/or at the sleeve structure in an area between the substrate and an end of the sleeve structure facing away from the substrate.

5. The micromechanical pressure sensor system as recited in claim 4, wherein the sealing area includes an area on a surface of the substrate which radially encloses the sleeve structure.

6. The micromechanical pressure sensor system as recited in claim 4, wherein the sealing area includes a surface of a radially extending flange of the hollow frustum-shaped sleeve structure.

7. The micromechanical pressure sensor system as recited in claim 4, wherein the sealing area includes at least a portion of a frustum jacket of the hollow frustum-shaped sleeve structure.

8. The micromechanical pressure sensor system as recited in claim 4, wherein the housing, at an end of the housing facing the substrate, includes a recess in which the sealing material and/or a flange of the sleeve structure engages for forming a mechanical stop.

9. A method for manufacturing a micromechanical pressure sensor system, comprising the following steps:
providing a micromechanical pressure sensor system including a substrate, a pressure sensor component connected to the substrate, and an essentially hollow frustum-shaped sleeve structure connected to the substrate, the sleeve structure surrounding the pressure sensor component at least laterally and having an opening at a side of the sleeve structure facing away from the substrate, wherein a wider axial end of the sleeve structure faces the substrate and a narrower axial end of the sleeve structure faces away from substrate, and an interior of the sleeve structure bounded by jacket walls of the sleeve structure is narrower at the narrower axial end than at the wider axial end, and wherein the sleeve structure is filled with a gel;
providing a housing; and
connecting the housing to the substrate in a gas-tight manner and to the sleeve structure using a sealing material in a sealing area, which is situated at the substrate and/or at the sleeve structure in an area between the substrate and an end of the sleeve structure facing away from the substrate.

10. A micromechanical pressure sensor system, comprising:
a substrate;
a pressure sensor component connected to the substrate;
a sleeve structure which is connected to the substrate, the sleeve structure surrounding the pressure sensor component at least laterally and includes a circumferential groove at a lateral outer side of the sleeve structure facing away from the pressure sensor component;
wherein the sleeve structure is configured differently on two sides of the groove; and
a housing which encompasses the sleeve structure, the housing resting on the substrate and connecting to the sleeve structure in a gas-tight manner using a sealing ring in the groove.

11. The micromechanical pressure sensor system as recited in claim 10, wherein the area of the sleeve structure is further removed from the substrate than the groove and has a lesser thickness in a radial direction than a section of the sleeve structure formed closer to the substrate.

12. The micromechanical pressure sensor system as recited in claim 11, wherein the area of the sleeve structure which is further removed from the substrate than the groove has an outwardly directed chamfer.

13. The micromechanical pressure sensor system as recited in claim 10, further comprising:
a housing; and
a sealing ring situated in the circumferential groove of the sleeve structure, the housing being connected to the sleeve structure in a gas-tight manner using the sealing ring.

14. A method for manufacturing a micromechanical pressure sensor system, comprising the following steps:
providing a micromechanical pressure sensor system including a substrate, a pressure sensor component connected to the substrate, and a sleeve structure which is connected to the substrate, the sleeve structure surrounding the pressure sensor component at least laterally and includes a circumferential groove at a lateral outer side of the sleeve structure facing away from the pressure sensor component, wherein the sleeve structure is configured differently on two sides of the groove; and
providing a housing which encompasses the sleeve structure, the housing resting on the substrate and connecting to the sleeve structure in a gas-tight manner using a sealing ring in the groove.

15. The micromechanical pressure sensor system as recited in claim 1, wherein the sleeve structure is manufactured from deep drawn metal.

16. The micromechanical pressure sensor system as recited in claim 3, wherein the closure structure includes an opaque layer.

* * * * *